United States Patent
Gredone et al.

(10) Patent No.: US 7,069,464 B2
(45) Date of Patent: *Jun. 27, 2006

(54) HYBRID PARALLEL/SERIAL BUS INTERFACE

(75) Inventors: Joseph Gredone, Chalfont, PA (US); Alfred Stufflet, Plymouth Meeting, PA (US); Timothy A. Axness, Collegeville, PA (US)

(73) Assignee: Interdigital Technology Corporation, Wilmington, DE (US)

( * ) Notice: Subject to any disclaimer, the term of this patent is extended or adjusted under 35 U.S.C. 154(b) by 827 days.

This patent is subject to a terminal disclaimer.

(21) Appl. No.: 09/990,060

(22) Filed: Nov. 21, 2001

(65) Prior Publication Data

US 2003/0095057 A1  May 22, 2003

(51) Int. Cl.
 *G06F 5/06* (2006.01)

(52) U.S. Cl. .................... 713/600; 713/600; 713/320; 365/189.01; 365/230.03; 365/230.04; 370/535; 370/536; 370/537; 341/101; 341/102; 341/103; 710/33; 710/71

(58) Field of Classification Search ............. 713/600, 713/320; 365/189.01, 189.04, 230.04, 230.03; 370/535, 536, 537; 341/100–103; 710/33, 710/71
See application file for complete search history.

(56) References Cited

U.S. PATENT DOCUMENTS

| | | | | |
|---|---|---|---|---|
| 4,675,861 A | * | 6/1987 | Uttermark | 398/98 |
| 5,018,142 A | * | 5/1991 | Simcoe et al. | 370/537 |
| 5,136,587 A | * | 8/1992 | Obana et al. | 370/535 |
| 5,327,126 A | | 7/1994 | Beanland | |
| 5,347,268 A | * | 9/1994 | Nelson et al. | 340/7.43 |
| 5,400,369 A | | 3/1995 | Ikemura | |
| 5,420,583 A | * | 5/1995 | Knecht et al. | 341/59 |
| 5,526,360 A | | 6/1996 | Kraft | |
| 5,541,596 A | | 7/1996 | Yoshida | |
| 5,544,319 A | * | 8/1996 | Acton et al. | 709/246 |
| 5,592,487 A | * | 1/1997 | Knecht et al. | 370/473 |
| 5,602,780 A | | 2/1997 | Diem et al. | |
| 5,847,578 A | | 12/1998 | Noakes et al. | |
| 5,926,120 A | | 7/1999 | Swenson et al. | |
| 6,040,792 A | | 3/2000 | Watson et al. | |
| 6,122,683 A | | 9/2000 | Ku et al. | |
| 6,128,244 A | | 10/2000 | Thompson et al. | |
| 6,134,247 A | | 10/2000 | Solana de Quesada et al. | |

FOREIGN PATENT DOCUMENTS

| | | |
|---|---|---|
| KR | 42847 | 4/1991 |
| KR | 1997-56528 | 7/1997 |

OTHER PUBLICATIONS

"21–Bit Channel Link", National Semiconductor, Jul. 1997, http://www.national.com/ds/DS/DS90CR21.pdl.*

(Continued)

*Primary Examiner*—Lynne H. Browne
*Assistant Examiner*—Nitin C. Patel
(74) *Attorney, Agent, or Firm*—Volpe and Koenig, P.C.

(57) ABSTRACT

A hybrid serial/parallel bus interface has a data block demultiplexing device. The data block demultiplexing device has an input configured to receive a data block and demultiplexes the data block into a plurality of nibbles. For each nibble, a parallel to serial converter converts the nibble into serial data. A line transfers each nibble's serial data. A serial to parallel converter converts each nibble's serial data to recover that nibble. A data block reconstruction device combines the recovered nibbles into the data block.

45 Claims, 8 Drawing Sheets

OTHER PUBLICATIONS

Novak et al., "Channel Link Moving and Shaping Information in Point–To–Point Application", National Semiconductor, May 1996, http://www.national.com/an/AN/AN–1041.pdl*
von Herzen et al., "Multi–Chanel 622 Mb/s LVDS Data Transfer for Virtex–E Devices", Xilinx Inc., Jan. 6, 2001, http://direct.xilinx.com/bvdocd/appnotes/xapp233.pdf.
Kitanovska et al., "Bus LVDS with Virtex–E Devices", Xilinx Inc., Jul. 26, 2000, http.//diret.xilinx.com/bvdocs/appnotes/xapp243.pdf.
Korean Patent Application Laid–Open No. 1997–56528 (Jul. 1997),#.

"21–Bit Channel Link", National Semiconductor, Jul. 1997, http://www.national.com/ds/DS/DS90CR21.pdf.
Novak et al., "Channel Link Moving and Shaping Information in Point–To–Point Application", National Semiconductor, May 1996, http://www.national.com/an/An/An–1041.pdf.
von Herzen et al., "Multi–Chanel 622 Mb/s LVDS Data Transfer for Virtex–E Devices", Xilinx Inc., Jan. 6, 2001, http://direct.xilinx.com/bvdocs/appnotes/xapp233.pdf.
Kitanovska et al., "Bus LVDS with Virtex–E Devices", Xilinx Inc., Jul. 26, 2000, http://direct.xilinx.com/bvdocs/appnotes/xapp243.pdf.

* cited by examiner

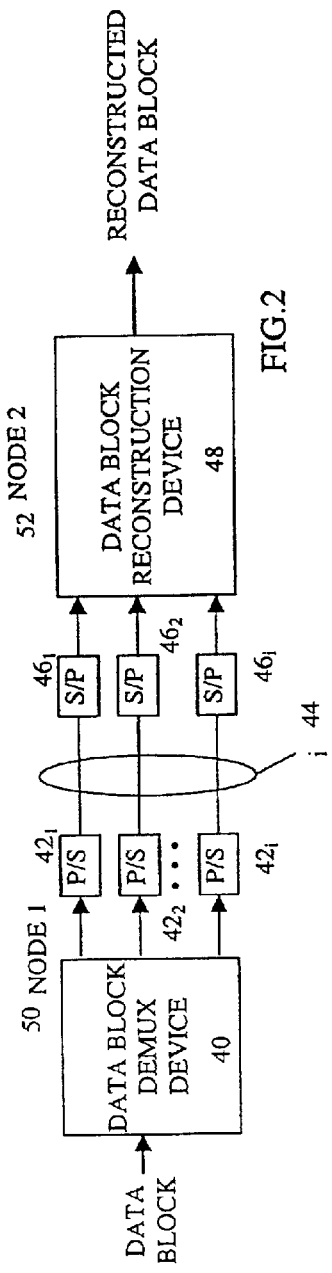
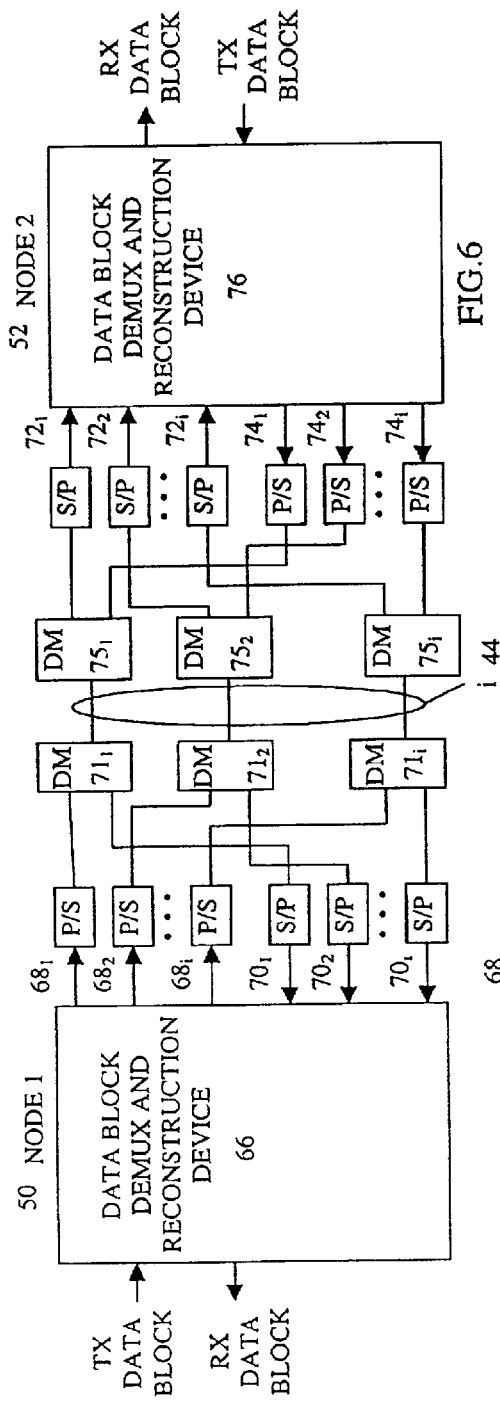
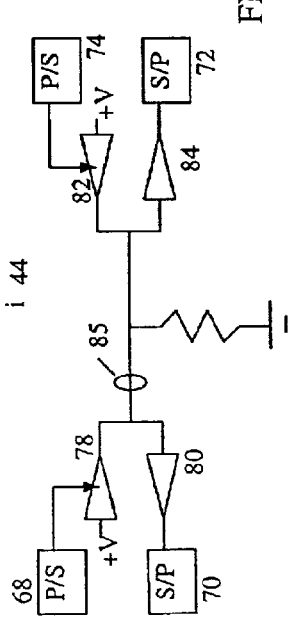
FIG.2
FIG.6
FIG.7

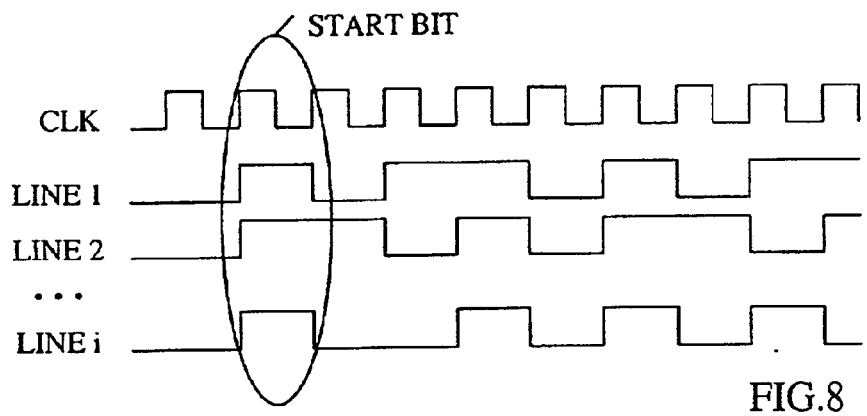
FIG.8
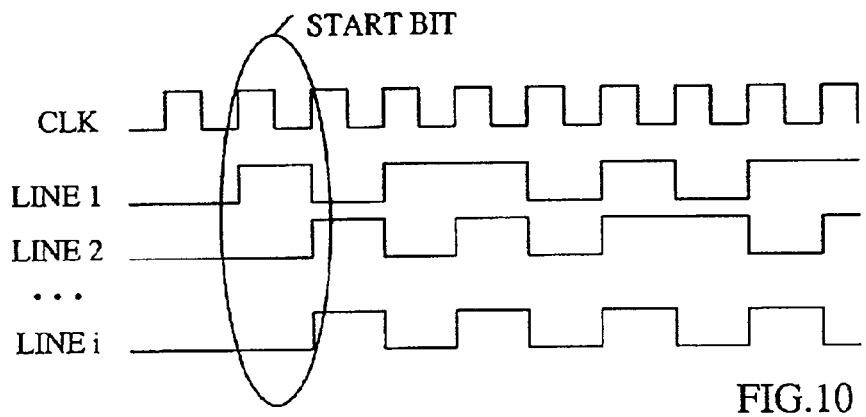
FIG.10
| FUNCTION | LINE 1 | LINE 2 |
|---|---|---|
| ABSOLUTE VALUE | 1 | 1 |
| RELATIVE INCREASE | 1 | 0 |
| RELATIVE DECREASE | 0 | 1 |
| NO DATA TRANSFERRED | 0 | 0 |
FIG.11
| FUNCTION | LINE 1 | LINE 2 |
|---|---|---|
| DEVICE 1 | 1 | 1 |
| DEVICE 2 | 1 | 0 |
| INVALID | 0 | 1 |
| NO DATA TRANSFERRED | 0 | 0 |
FIG.13

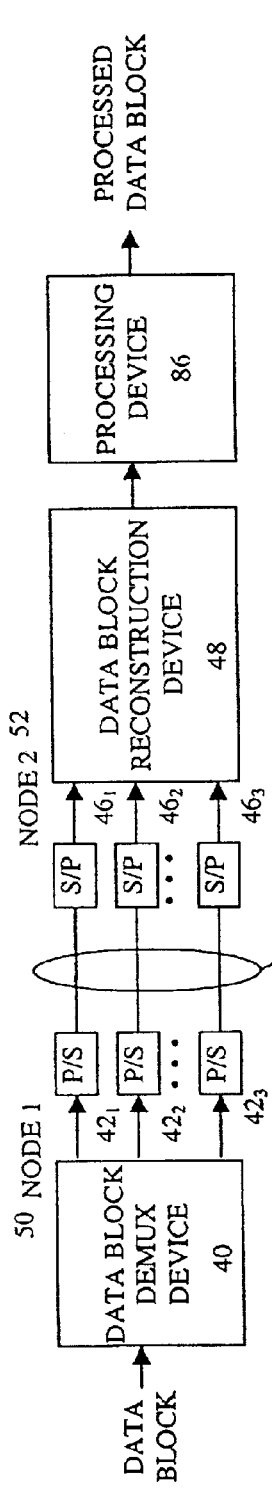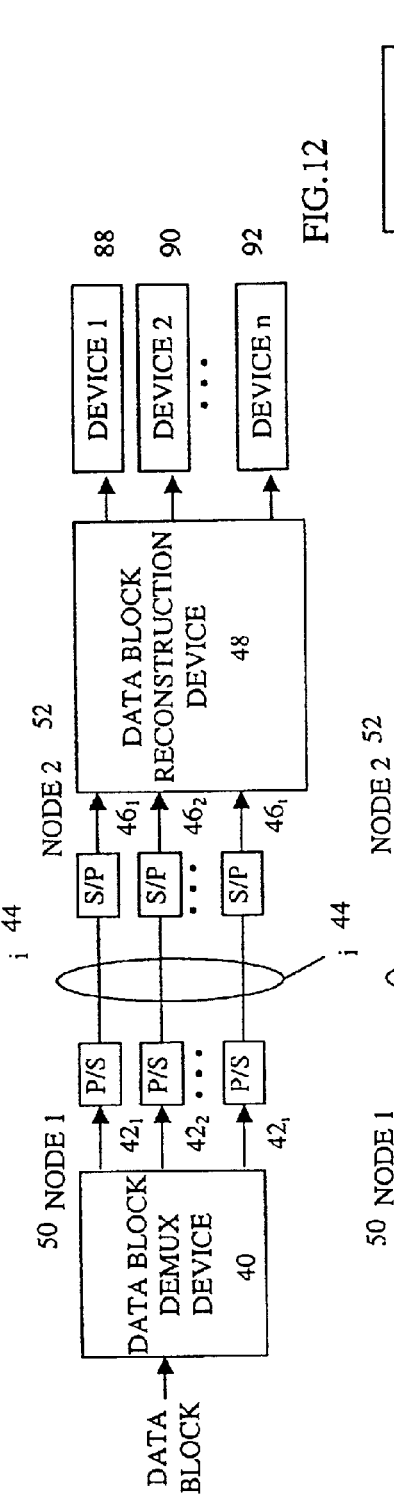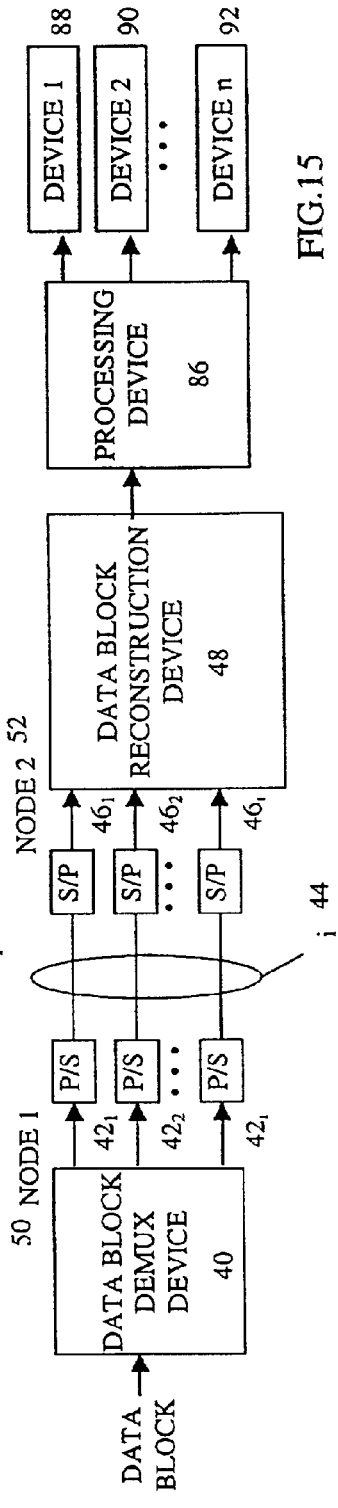

| FUNCTION/DEVICE | LINE 1 | LINE 2 | LINE 3 |
|---|---|---|---|
| ABSOLUTE VALUE/DEVICE 2 | 1 | 1 | 1 |
| ABSOLUTE VALUE/DEVICE 1 | 1 | 1 | 0 |
| RELATIVE INCREASE/DEVICE 2 | 1 | 0 | 1 |
| RELATIVE INCREASE/DEVICE 1 | 1 | 0 | 0 |
| RELATIVE DECREASE/DEVICE 2 | 0 | 1 | 1 |
| RELATIVE DECREASE/DEVICE 1 | 0 | 1 | 0 |
| INVALID | 0 | 0 | 1 |
| NO DATA TRANSFERRED | 0 | 0 | 0 |
FIG.14
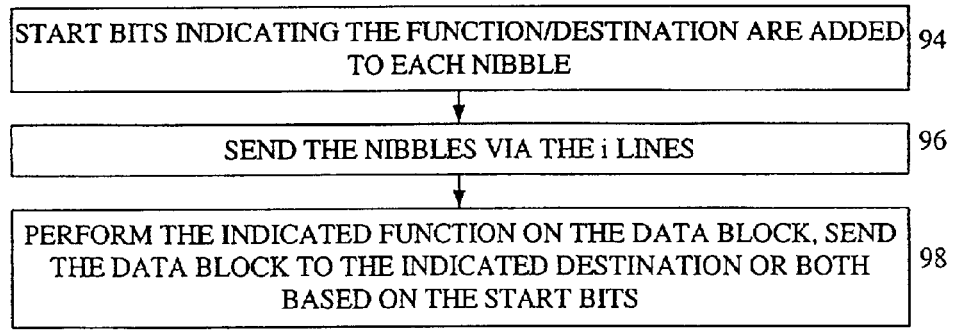
FIG.16
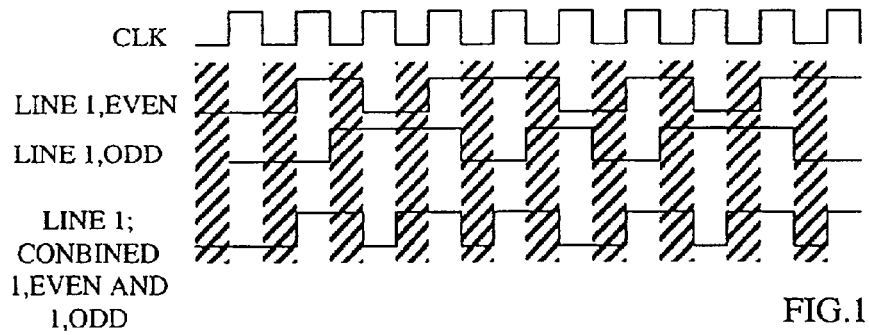
FIG.18 ized data may be sent in the other direction. To illustrate, FIG. 7 shows one implementation of a single bi-directional line of the i lines.

HYBRID PARALLEL/SERIAL BUS INTERFACE

BACKGROUND

The invention relates to bus data transfers. In particular, the invention relates to reducing lines to transfer bus data.

One example of a bus used to transfer data is shown in FIG. 1. FIG. 1 is an illustration of a receive and transmit gain controllers (GCs) 30, 32 and a GC controller 38 for use in a wireless communication system. A communication station, such as a base station or user equipment, transmits (TX) and receives (RX) signals. To control the gain of these signals, to be within the operating ranges of other reception/ transmission components, the GCs 30, 32 adjust the gain on the RX and TX signals.

To control the gain parameters for the GCs 30, 32, a GC controller 38 is used. As shown in FIG. 1, the GC controller 38 uses a power control bus, such as a sixteen line bus 34, 36, to send a gain value for the TX 36 and RX 34 signals, such as eight lines for each. Although the power control bus lines 34, 36 allow for a fast data transfer, it requires either many pins on the GCs 30, 32 and the GC controller 38 or many connections between the GCs 30, 32 and GC controller 38 on an integrated circuit (IC), such as an application specific IC (ASIC). Increasing the number of pins requires additional circuit board space and connections. Increasing IC connections uses valuable IC space. The large number of pins or connections may increase the cost of a bus depending on the implementation.

Accordingly, it is desirable to have other data transfer approaches.

SUMMARY

A hybrid serial/parallel bus interface has a data block demultiplexing device. The data block demultiplexing device has an input configured to receive a data block and demultiplexes the data block into a plurality of nibbles. For each nibble, a parallel to serial converter converts the nibble into serial data. A line transfers each nibble's serial data. A serial to parallel converter converts each nibble's serial data to recover that nibble. A data block reconstruction device combines the recovered nibbles into the data block.

BRIEF DESCRIPTION OF THE DRAWING(S)

FIG. 2 is a block diagram of a hybrid parallel/serial bus interface.

FIG. 6 is a block diagram of a bi-directional hybrid parallel/serial bus interface.

FIG. 7 is a diagram of an implementation of one bi-directional line.

FIG. 8 is a timing diagram illustrating start bits.

FIG. 9 is a block diagram of a function controllable hybrid parallel/serial bus interface.

FIG. 10 is a timing diagram of start bits for a function controllable hybrid parallel/serial bus interface.

FIG. 11 is a table of an implementation of start bits indicating functions.

FIG. 12 is a block diagram of a destination controlling hybrid parallel/serial bus interface.

FIG. 13 is a table of an implementation of start bits indicating destinations.

FIG. 14 is a table of an implementation of start bits indicating destinations/functions.

FIG. 15 is a block diagram of a destinations/functions controlling hybrid parallel/serial bus interface.

FIG. 16 is a flow chart for start bits indicating destinations/functions.

FIG. 18 is a timing diagram for a positive and negative clock edge hybrid parallel/serial bus interface.

DETAILED DESCRIPTION OF THE PREFERRED EMBODIMENT(S)

Figure 1:
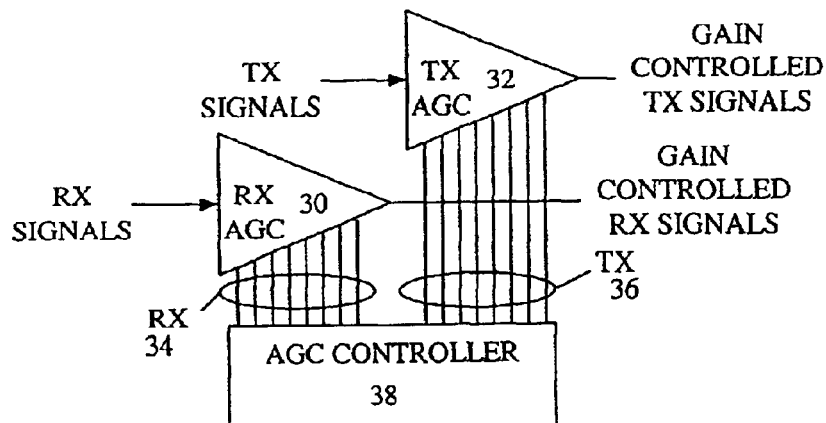
FIG. 1 is an illustration of a RX and TX GC and a GC controller.
Figure 3:
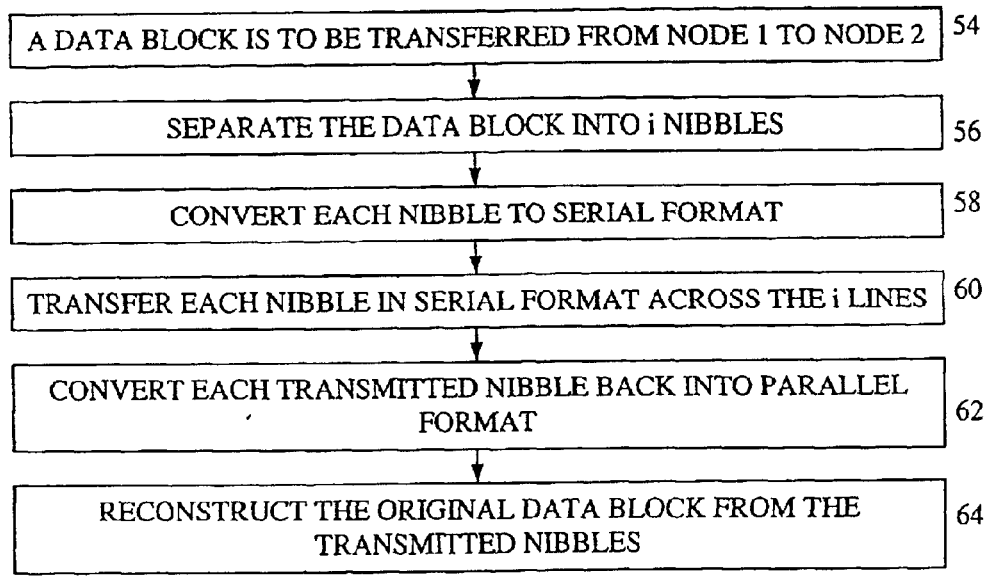
FIG. 3 is a flow chart for transferring data blocks using a hybrid parallel/serial bus interface.
Figure 4:
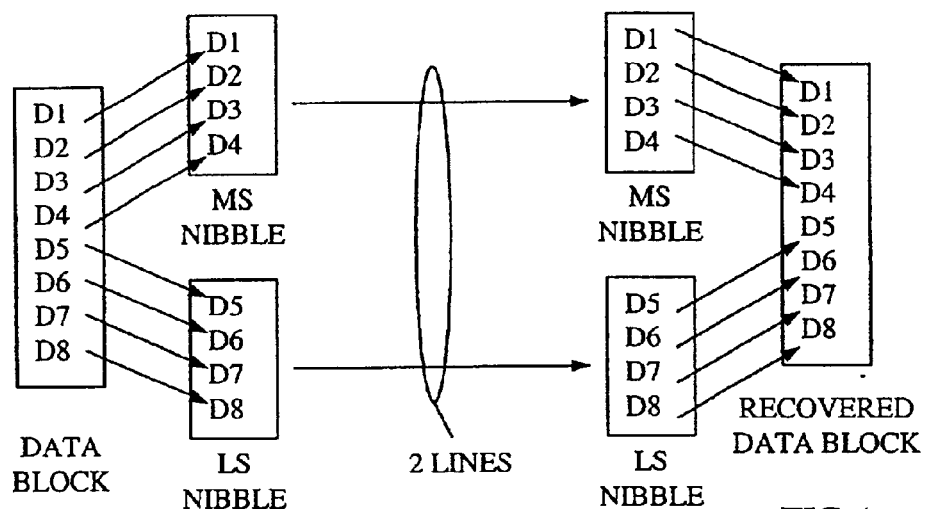
FIG. 4 illustrates demultiplexing a block into a most significant and least significant nibble.

FIG. 2 is a block diagram of a hybrid parallel/serial bus interface and FIG. 3 is a flow chart of hybrid parallel/serial bus interface data transfer. A data block is to be transferred across the interface from node 1 50 to node 2 52, (54). A data block demultiplexing device 40 receives the block and demultiplexes it into i nibbles for transfer over i data transfer lines 44, (56). The value for i is based on a tradeoff between number of connections and transfer speed. One approach to determine i is to first determine a maximum latency permitted to transfer the data block. Based on the allowed maximum latency, a minimum number of lines required to transfer the block is determined. Using the minimum number of lines, the lines used to transfer the data is selected to be at least the minimum. The lines 44 may be the pins and their associated connections on a circuit board or connections on an IC. One approach to demultiplex into nibbles divides the block into a most significant to a least significant nibble. To illustrate for an eight bit block transfer over two lines as shown in FIG. 4, the block is demultiplexed into a four bit most significant nibble and a four bit least significant nibble.

Figure 5:
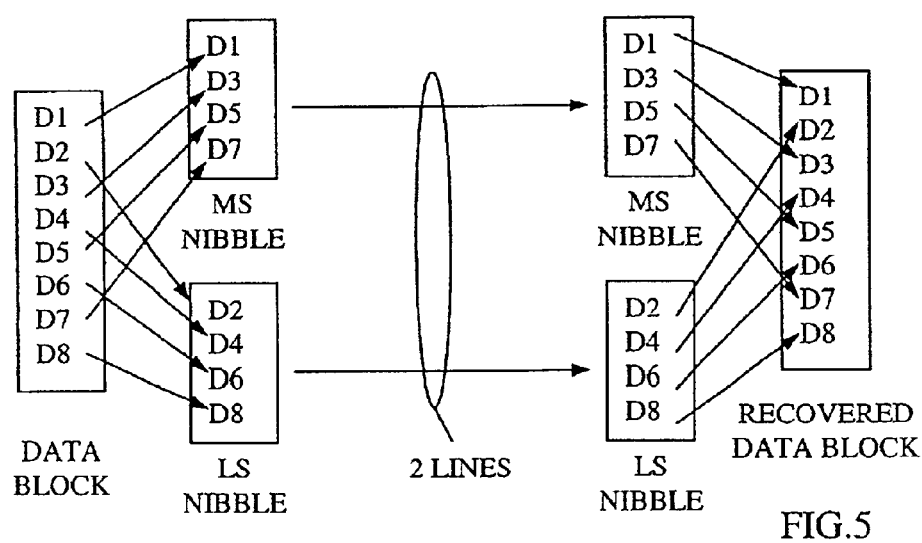
FIG. 5 illustrates demultiplexing a block using data interleaving.

Another approach interleaves the block across the i nibbles. The first i bits of the block become the first bit in each nibble. The second i bits become the second bit in each nibble and so on until the last i bits. To illustrate for an eight bit block over two connections as shown in FIG. 5, the first bit is mapped to the first bit of nibble one. The second bit is mapped to the first bit of nibble two. The third bit is mapped to the second bit of nibble one and so on until the last bit is mapped to the last bit of nibble two.

Each nibble is sent to a corresponding one of i parallel to serial (P/S) converters 42, (58), converted from parallel bits to serial bits, and transferred serially across its line, (60). On the opposing end of each line is a serial to parallel (S/P) converter 46. Each S/P converter 46 converts the transmitted serial data into its original nibble, (62). The i recovered nibbles are processed by a data block reconstruction device 48 to reconstruct the original data block, (64).

In another, bidirectional, approach, the i connections are used to transfer data in both directions as shown in FIG. 6. Information data may be transferred in both directions or information may be sent in one direction and an acknowledgment sent back in the other direction. A data block for transfer from node 1 50 to node 2 52 is received by the data block demultiplexing and reconstruction device 66. The demultiplexing and reconstruction device 66 demultiplexes the block into i nibbles. i P/S converters 68 convert each nibble into serial data. A set of multiplexers (MUXs)/DEMUXs 71 couples each P/S converter 68 to a corresponding one of the i lines 44. At node 2 52, another set of MUXs/DEMUXs 75 connects the lines 44 to a set of S/P converters 72. The S/P converters 72 convert the received serial data of each nibble into the originally transmitted nibbles. The received nibbles are reconstructed by a data block demultiplexing and reconstruction device 76 into the original data block and output as the received data block.

For blocks transferred from Node 2 52 to Node 1 50, a data block is received by the data block demultiplexing and reconstruction device 76. That block is demultiplexed into nibbles and the nibbles are sent to a set of P/S converters 74. The P/S converters 74 convert each nibble into serial format for transfer across the i lines 44. A Node 2 set of MUXs/DEMUXs 75 couples the P/S converters 74 to the i lines 44 and a Node 1 set of MUXs/DEMUXs 71 couples the lines 44 to i S/P converters 70. The S/P converters 70 convert the transmitted data into its original nibbles. The data block demultiplexing and reconstruction device 66 reconstructs the data block from the received nibbles to output the received data block. Since data is only sent in one direction at a time, this implementation operates in a half duplex mode.

FIG. 7 is a simplified diagram of one implementation of bidirectional switching circuits. The serial output from the node 1 P/S converter 68 is input into a tri-statable buffer 78. The buffer 78 has another input coupled to a voltage representing a high state. The output of the buffer 78 is the serial data which is sent via the line 85 to a Node 2 tri-statable buffer 84. A resistor 86 is coupled between the line 85 and ground. The Node 2 buffer 84 passes the serial data to a Node 2 S/P converter 72. Similarly, the serial output from the Node 2 P/S converter 74 is input into a tri-statable buffer 72. That buffer 72 also has another input coupled to a high voltage. The serial output of that buffer 82 is sent via the line 85 to a Node 1 tri-statable buffer 80. The Node 1 buffer 80 passes the serial data to a Node 1 S/P converter 70.

In another implementation, some of the i lines 44 may transfer data in one direction and the other i lines 44 transfer data in another direction. At Node 1 50, a data block is received for transmission to Node 2 52. Based on the data throughput rate required for the block and the traffic demand in the opposite direction, j, being a value from 1 to i, of the connections are used to transfer the block. The block is broken into j nibbles and converted to j sets of serial data using j of the i P/S converters 68. A corresponding j Node 2 S/P converters 72 and the Node 2 data block separation and reconstruction device 76 recovers the data block. In the opposite direction, up to i-j or k lines are used to transfer block data.

In a preferred implementation of the bidirectional bus for use in a gain control bus, a gain control value is sent in one direction and an acknowledgment signal is sent back. Alternately, a gain control value is sent in one direction and a status of the gain control device in the other direction.

One implementation of the hybrid parallel/serial interface is in a synchronous system and is described in conjunction with FIG. 8. A synchronous clock is used to synchronize the timing of the various components. To indicate the start of the data block transfer, a start bit is sent. As shown in FIG. 8, each line is at its normal zero level. A start bit is sent indicating the beginning of the block transfer. In this example, all the lines send a start bit, although it is only necessary to send a start bit over one line. If a start bit, such as a one value, is sent over any line, the receiving node realizes that the block data transfer has begun. Each serial nibble is sent through its corresponding line. After transfer of the nibbles, the lines return to their normal state, such as all low.

In another implementation, the start bits are also used as an indicator of functions to be performed. An illustration of such an implementation is shown in FIG. 9. As shown in FIG. 10, if any of the connections's first bits are a one, the receiving node realizes block data is to be transferred. As shown in the table of FIG. 11 for a GC controller implementation, three combinations of start bits are used, "01," "10" and "11." "00" indicates a start bit was not sent. Each combination represents a function. In this illustration, "01" indicates that a relative decrease function should be performed, such as decreasing the data block value by 1. A "10" indicates that a relative increase function should be performed, such as increasing the data block value by 1. A "11" indicates an absolute value function, where the block maintains the same value. To increase the number of available functions, additional bits are used. For example, 2 starting bits per line are mapped to up to seven (7) functions or n starting bits for i lines are mapped up to $i^{n+1}$-1 functions. The processing device 86 performs the function on the received data block as indicated by the starting bits.

In another implementation as shown in FIG. 12, the start bits indicate a destination device. As illustrated in FIG. 13 for a two destination device/two line implementation, the combination of start bits relates to a destination device 88-92 for the transferred data block. A "01" represents device 1; a "10" represents device 2; and a "11" represents device 3. After receipt of the start bits of the data block reconstruction device 48, the reconstructed block is sent to the corresponding device 88–92. To increase the number of potential destination devices, additional start bits may be used. For n starting bits over each of i lines, up to $i^{n+1}$-1 devices are selected.

As illustrated in the table of FIG. 14, the start bits may be used to represent both function and destination device. FIG. 14 shows a three connection system having two devices, such as a RX and TX GC. Using the start bit for each line, three functions for two devices is shown. In this example, the start bit for line 1 represents the target device, a "0" for device 1 and a "1" for device 2. The bits for connections 2 and 3 represent the performed function. A "11" represents an absolute value function; a "10" represents a relative increase function; and a "01" represents a relative decrease. All three start bits as a zero, "000," is the normal non-data transfer state and "001" is not used. Additional bits may be used to add more functions or devices. For n starting bits over each of i lines, up to $i^{n+1}$-1 function/device combinations are possible.

FIG. 15 is a block diagram for a system implementing the start bits indicating both function and destination device. The recovered nibbles are received by the data block reconstruction device 48. Based on the received start bits, the processing device 86 performs the indicated function and the processed block is sent to the indicated destination device 88–92.

As shown in the flow chart of FIG. 16, the start bits indicating the function/destination are added to each nibble, (94). The nibbles are sent via the i lines, (96). Using the start bits, the proper function is performed on the data block, the data block is sent to the appropriate destination or both, (98).

Figure 17:
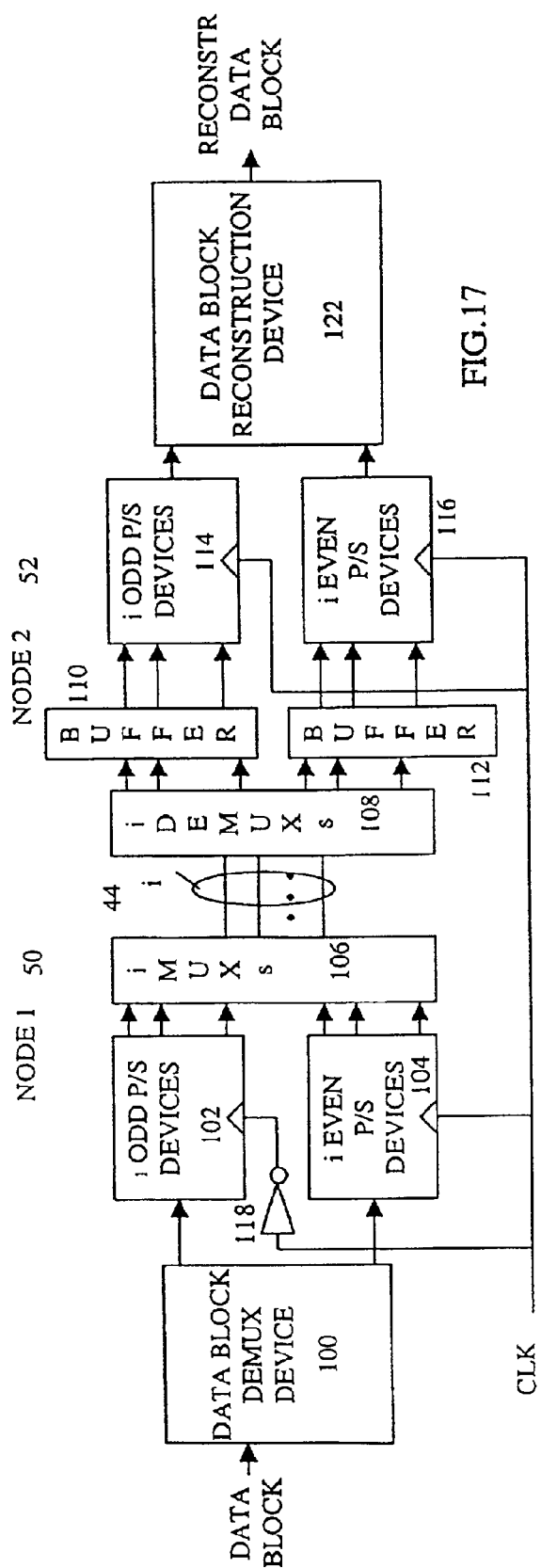
FIG. 17 is a block diagram for a positive and negative clock edge hybrid parallel/serial bus interface.

To increase the throughput in a synchronous system, both the positive (even) and negative (odd) edge of the clock are used to transfer block data. One implementation is shown in FIG. 17. The data block is received by a data block demultiplexing device 100 and demultiplexed into two (even and odd) sets of i nibbles. Each set of the i nibbles is sent to a respective set of i P/S devices 102, 104. As shown in FIG. 17, an odd P/S device set 102, having i P/S devices, has its clock signal inverted by an invertor 118. As a result, the inverted clock signal is half a clock cycle delayed with respect to the system clock. A set of i MUXs 106 select at twice the clock rate between the even P/S device set 104 and the odd P/S device set 102. The resulting data transferred over each connection is at twice the clock rate. At the other end of each connection is a corresponding DEMUX 108. The DEMUXs 108 sequentially couple each line 44 to an even 112 and odd 110 buffer, at twice the clock rate. Each buffer 112, 110 receives a corresponding even and odd bit and holds that value for a full clock cycle. An even 116 and odd 114 set of S/P devices recover the even and odd nibbles. A data block reconstruction device 122 reconstructs the data block from the transferred nibbles.

FIG. 18 illustrates the data transfer over a line of a system using the positive and negative clock edge. Even data and odd data to be transferred over line 1 is shown. The hatching indicates the negative clock edge data in the combined signal and no hatching the even. As shown, the data transfer rate is increased by two.

Figure 19:
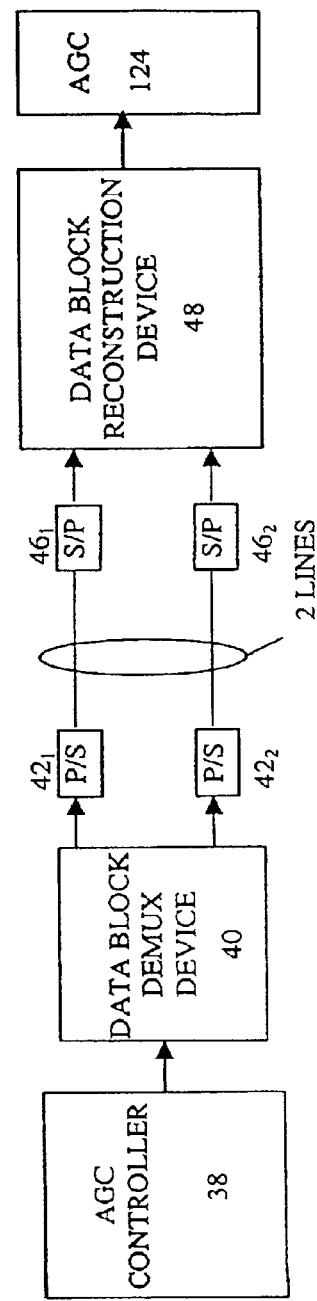
FIG. 19 is a block diagram of a 2-line GC/GC controller bus.

FIG. 19 is a preferred implementation of the hybrid parallel/serial interface used between a GC controller 38 and AGC 124. A data block, such as having 16 bits of GC control data (8 bits RX and 8 bits TX), is sent from the GC controller 38 to a data block demultiplexing device 40. The data block is demultiplexed into two nibbles, such as two eight bit nibbles. A start bit is added to each nibble, such as making 9 bits per nibble. The two nibbles are transferred over two lines using two P/S converters 42. The S/P converters 46 upon detecting the start bits convert the received nibbles to parallel format. The data block reconstruction device reconstructs the original 16 bits to control the gain of the GC 124. If a function is indicated by the start bits, such as in FIG. 11, the AGC 124 performs that function on the received block prior to adjusting the gain.

Figure 20:
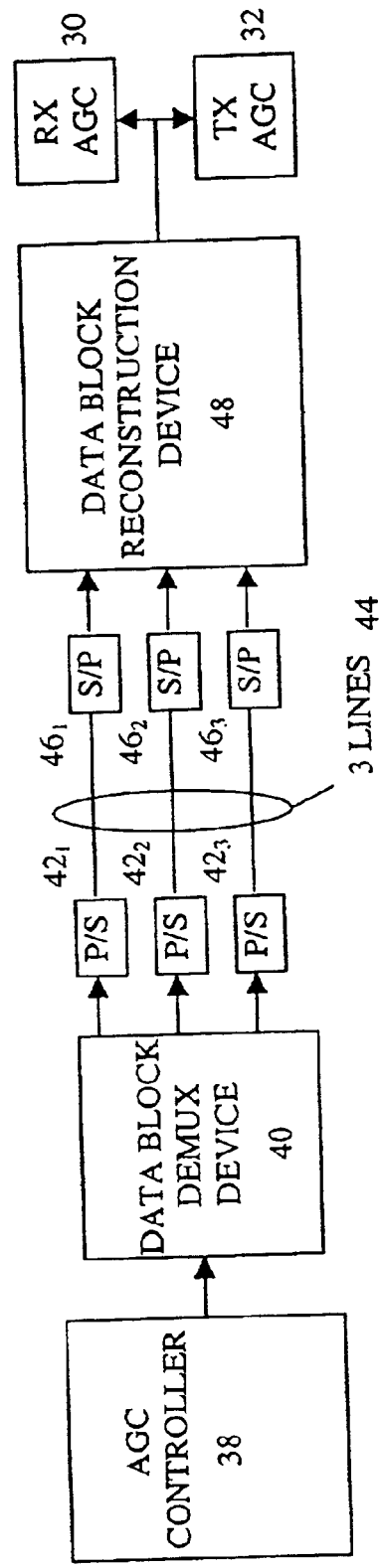
FIG. 20 is a block diagram of a 3-line GC/GC controller bus.

FIG. 20 is another preferred implementation for a hybrid parallel/serial converter, using three (3) lines, between a GC controller 38 and a RX GC 30 and TX GC 32. The GC controller 38 sends a data block to the GC 30, 32 with proper RX and TX gain values and start bits, such as per FIG. 14. If the start bits per FIG. 14 are used, Device 1 is the RX GC 30 and Device 2 is the TX GC 32. The data block demultiplexing device 40 demultiplexes the data block into three nibbles for transfer over the three lines. Using the three P/S converters 42 and three S/P converters 46, the nibbles are transferred serially over the lines and converted into the original nibbles. The data block reconstruction device 48 reconstructs the original data block and performs the function as indicated by the start bits, such as relative increase, relative decrease and absolute value. The resulting data is sent to either the RX or TX GC 30, 32 as indicated by the start bits.

What is claimed is:

1. A hybrid serial to parallel bus interface comprising: a data block demultiplexing device having an input configured to receive a data block and demultiplexing the data block into a plurality of nibbles, each nibble having a plurality of bits; for each nibble: a parallel to serial converter for converting that nibble into serial data; a line for transferring that nibble serial data; and a serial to parallel converter for converting that nibble serial data to recover that nibble; and a data block reconstruction device for combining the recovered nibbles into the data block.

2. The interface of claim 1 wherein a number of bits in a data block is N and a number of the lines is i and 1<i<N.

3. The interface of claim 1 wherein a number of bits in a nibble is four and a number of lines is two.

4. A hybrid serial to parallel bus interface comprising: means having an input configured to receive a data block for demultiplexing the data block into a plurality of nibbles, each nibble having a plurality of bits; for each nibble: means for converting that nibble into serial data; a line for transferring that nibble serial data; and means for converting that nibble serial data to recover that nibble; and means for combining the recovered nibbles into the data block.

5. The interface of claim 4 wherein a number of bits in a data block is N and a number of the lines is i and 1<i<N.

6. The interface of claim 4 wherein a number of bits in a nibble is four and a number of lines is two.

7. A method for transferring data, the method comprising: providing a data block; demultiplexing the data block into a plurality of nibbles, each nibble having a plurality of bits; for each nibble: converting that nibble into serial data; providing a line and transferring the nibble serial data over the line; converting that nibble serial data into parallel data to recover that nibble; and combining the recovered nibbles into the data block.

8. The method of claim 7 wherein a number of bits in a data block is N and a number of the lines is i and 1<i<N.

9. The method of claim 7 wherein a number of bits in a nibble is four and a number of lines is two.

10. A method for transferring a data block through an interface connecting a first node to a second node, the method comprising: demultiplexing the data block into m sets of n bits; adding a start bit to each of the m sets, the m start bits collectively representing one of a particular mathematical function or destination; transferring from the first node each of the m sets over a separate line; receiving at the second node each of the transferred m sets; and utilizing the received in sets in accordance with the m start bits.

11. The method of claim 10 further comprising:
wherein at least one of the m start bits being in a one state and when the interface is not transmitting data, all the separate lines being in a zero state.

12. The method of claim 10 wherein the m start bits represent a start of data transfer.

13. The method of claim 10 wherein the m start bits collectively represent a particular mathematical function and not a destination.

14. The method of claim 10 wherein functions that the m start bits collectively represent include a relative increase, a relative decrease and an absolute value functions.

15. The method of claim 10 wherein the m start bits collectively represent a particular destination and not a mathematical function.

16. The method of claim 15 wherein destinations that the m start bits collectively represent include a receive and transmit gain controller.

17. A method for transferring a data block through an interface connecting a first node to a second node, the method comprising: demultiplexing the data block into m sets of n bits: adding a start bit to each of the m sets, the m start bits collectively representing both a particular mathematical function and destination; transferring from the first node each of the m sets over a separate line; receiving at the second node each of the transferred m sets; and utilizing the received m sets in accordance with the m start bits.

18. A hybrid serial to parallel bus interface for transferring data from a first node to a second node, the interface comprising: a data block demultiplexing device for demultiplexing a data block from the first node into m sets of n bits and for adding a start bit to each of the m sets, the m start bits collectively representing one of a particular mathematical function or destination; for each of the m sets, a separate line for transferring that set of the m sets from the first node to the second node; a data block reconstruction device for receiving the m sets, for combining the m sets into the data block and for utilizing the m sets in accordance with the m start bits.

19. The interface of claim 18 wherein at least one of the m start bits being in a one state and when the interface is not transmitting data, all the separate lines being in a zero state.

20. The interface of claim 18 wherein the m start bits represent a start of data transfer.

21. The interface of claim 18 wherein the m start bits collectively represent a particular mathematical function and not a destination.

22. The interface of claim 18 wherein functions that the m start bits collectively represent include a relative increase, a relative decrease and an absolute value functions.

23. The interface of claim 18 wherein the m start bits collectively represent a particular destination and not a mathematical function.

24. The interface of claim 23 wherein destinations that the m start bits collectively represent include a receive and transmit gain controller.

25. A hybrid serial to parallel bus interface for transferring data from a first node to a second node, the interface comprising: a data block demultiplexing device for demultiplexing a data block from the first node into m sets of n bits and for adding a start bit to each of the m sets, the m start bits collectively representing both a particular mathematical function and destination; for each of the m sets, a separate line for transferring that set of the m sets from the first node to the second node; and a data block reconstruction device for receiving the m sets, for combining the m sets into the data block and for utilizing the m sets in accordance with the m start bits.

26. A hybrid serial to parallel bus interface for transferring data from a first node to a second node, the interface comprising: means for demultiplexing a data block into m sets of n bits; means for adding a start bit to each of the m sets, the m start bits collectively representing one of a particular mathematical function or destination; means for transferring from the first node each of the m sets over a separate line; means for receiving at the second node each of the transferred m sets; and means for utilizing the received m sets in accordance with the m start bits.

27. The interface of claim 26 wherein at least one of the m start bits being in a one state and when the interface is not transmitting data, all the separate lines being in a zero state.

28. The interface of claim 26 wherein the m start bits represent a start of data transfer.

29. The interface of claim 26 wherein the m start bits collectively represent a particular mathematical function and not a destination.

30. The interface of claim 26 wherein functions that the m start bits collectively represent include a relative increase, a relative decrease and an absolute value functions.

31. The interface of claim 26 wherein the m start bits collectively represent a particular destination and not a mathematical function.

32. The interface of claim 31 wherein destinations that the m start bits collectively represent include a receive and transmit gain controller.

33. A hybrid serial to parallel bus interface for transferring data from a first node to a second node, the interface comprising: means for demultiplexing a data block into m sets of n bits: means for adding a start bit to each of the m sets, the m start bits collectively representing both a particular mathematical function and destination; means for transferring from the first node each of the m sets over a separate line; means for receiving at the second node each of the transferred m sets: and means for utilizing the received m sets in accordance with the m start bits.

34. A hybrid serial to parallel bus interface for use in a synchronous system, the synchronous system having an associated clock, the bus interface comprising: a data block demultiplexing device having an input configured to receive a data block and demultiplexing the data block into a plurality of nibbles, each nibble having a plurality of bits; an even and odd set of parallel to serial (P/S) converters, each set of P/S converters receiving the nibbles synchronous with a clock rate of the clock, and for converting the nibbles into a serial data; a first set of i multiplexers for transferring the even P/S converters set serial data on a positive edge of the clock over i lines and the odd P/S converters set serial data on a negative edge of the clock over i lines; a second set of i demultiplexers for receiving the even and odd transferred serial data and sending the even received serial data to an ever buffer and the odd serial data to an odd buffer; an even and odd set of serial to parallel (S/P) converters, the even set of S/P converters for converting the even received serial data to even parallel data and outputting the even parallel data synchronous with the clock; and the odd set of S/P converters for converting the odd received serial data to odd parallel data and outputting the odd parallel data synchronous with the clock; and a data block reconstruction device for combining the even and odd parallel data as the data block.

35. The interface of claim 34 wherein each data block has N bits and $1<i<N$.

36. The interface of claim 34 wherein the even and odd buffer buffers the even and odd set of S/P converters input so that the even and odd set of S/P converters receive the even and odd received serial data synchronous with the clock.

37. A method for determining a number of i bus connections required to transfer block data over a bus, each block of the block data having N number of bits, the method comprising: determining a maximum latency allowed for transfer of the block data; determining a minimum number of connections required to transfer the data block with the maximum latency; and determining i with i being a value at least the minimum number of required connections.

38. The method of claim 37 wherein the i bus connections correspond to i pins on a chip.

39. The method of claim 38 wherein $1<i<N$.

40. A system using a bi-directional serial to parallel bus interface comprising: a plurality of lines for transferring data blocks, the plurality of lines numbering less than a number of bits of each data block; a first node sending first data blocks to a second node over the plurality of lines, the first node capable of demultiplexing the data block into a plurality of first nibbles, the plurality of first nibbles numbering a same number as the plurality of lines, each nibble having a plurality of bits; and the second node sending second data blocks to the first node over the plurality of lines, the second node capable of demultiplexing the data block into a plurality of second nibbles, the plurality of second nibbles numbering a same number as the plurality of lines, each nibble having a plurality of bits.

41. The system of claim 40 wherein the first node capable of demultiplexing the data block into a plurality of third nibbles, a number j of the third nibbles is less than the number N of lines and transferring the third nibbles oven j lines.

42. The system of claim 41 wherein the second node capable of demultiplexing forth data blocks into K bits, where K is less than or equal to N-j lines, and transferring the fourth data block over K lines.

43. The system of claim 40 wherein the first node data blocks include gain control information.

44. The system of claim 43 wherein the second node data blocks include an acknowledgment of receipt of the gain control information.

45. The system of claim 43 wherein the second node data blocks include information of a status associated with the second node.

* * * * *

UNITED STATES PATENT AND TRADEMARK OFFICE
CERTIFICATE OF CORRECTION

| | | |
|---|---|---|
| PATENT NO. | : 7,069,464 B2 | |
| APPLICATION NO. | : 09/990060 | |
| DATED | : June 27, 2006 | |
| INVENTOR(S) | : Gredone et al. | |

It is certified that error appears in the above-identified patent and that said Letters Patent is hereby corrected as shown below:

ON THE TITLE PAGE:

Item (56), OTHER PUBLICATIONS, page 2, left column, line 4, delete line 4 and insert therefor -- AN -- 104.pdf.--.
Item (56), OTHER PUBLICATIONS, page 2, left column, line 5, before "622 Mb/s", delete ""Multi-Chanel" and insert therefor --Multi-Channel--.
Item (56), OTHER PUBLICATIONS, page 2, left column, line 7, delete line 7 and insert therefor --http://direct.xilinx.com/bvdocs/appnotes.xapp233.pdf.--.
Item (56), OTHER PUBLICATIONS, page 2, right column, line 7, before "622 Mb/s", delete ""Multi-Chanel" and insert therefor --"Multi-Channel--.

IN THE DRAWINGS:

At FIG. 7, to grounded resister add notation --86--.

IN THE SPECIFICATION:

At column 1, line 48, after the words "illustration of", delete "a" and insert therefor --an--.
At column 3, line 41, after the first use of the word "buffer", delete "72. That buffer 72" and insert therefor --82. That buffer 82.--.
At column 4, line 46, after the words "such as", delete "a" and insert therefor --an--.
At column 5, line 48, before "RX GC", delete "a" and insert therefor --an--.

IN THE CLAIMS:

At claim 14, column 6, line 55, after the word "value", delete "functions" and insert therefor --function--.
At claim 22, column 7, line 25, after the word "value", delete "functions" and insert therefor --function--.
At claim 30, column 7, line 64, after the word "value", delete "functions" and insert therefor --function--.
At claim 34, column 8, line 30, before the word "buffer", delete "ever" and insert therefor --even--.
At claim 41, column 9, line 6, after the word "nibbles", delete "oven" and insert therefor --over--.

UNITED STATES PATENT AND TRADEMARK OFFICE
CERTIFICATE OF CORRECTION

PATENT NO. : 7,069,464 B2
APPLICATION NO. : 09/990060
DATED : June 27, 2006
INVENTOR(S) : Gredone et al.

It is certified that error appears in the above-identified patent and that said Letters Patent is hereby corrected as shown below:

IN THE CLAIMS: (cont'd)

At claim 42, column 9, line 9, after the word "demultiplexing", delete "forth" and insert therefor --fourth--.

Signed and Sealed this

Twenty-fifth Day of September, 2007

JON W. DUDAS
*Director of the United States Patent and Trademark Office*

UNITED STATES PATENT AND TRADEMARK OFFICE
CERTIFICATE OF CORRECTION

PATENT NO. : 7,069,464 B2
APPLICATION NO. : 09/990060
DATED : June 27, 2006
INVENTOR(S) : Gredone et al.

Page 1 of 1

It is certified that error appears in the above-identified patent and that said Letters Patent is hereby corrected as shown below:

IN THE CLAIMS:

At claim 1, column 5, line 66, delete "demultiplexing" and insert therefor --demultiplex--.

At claim 34, column 8, line 18, delete "demultiplexing" and insert therefor --demultiplex--.

At claim 41, column 9, line 3, before the word "capable", insert therefor --is--.

At claim 42, column 9, line 8, before the word "capable", insert therefor --is--.

Signed and Sealed this
Sixth Day of August, 2013

Teresa Stanek Rea
*Acting Director of the United States Patent and Trademark Office*